(12) United States Patent
Lu et al.

(10) Patent No.: US 11,968,792 B2
(45) Date of Patent: Apr. 23, 2024

(54) CHASSIS WITH SUNKEN HANDLES FOR HANDLING CHASSIS AND COMPUTER

(71) Applicant: Fulian Precision Electronics (Tianjin) Co., LTD., Tianjin (CN)

(72) Inventors: Wen-Hu Lu, Tianjin (CN); Li-Yi Yin, Tianjin (CN); Shu-Tong Wang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 234 days.

(21) Appl. No.: 17/729,137

(22) Filed: Apr. 26, 2022

(65) Prior Publication Data

US 2022/0346244 A1  Oct. 27, 2022

(30) Foreign Application Priority Data

Apr. 27, 2021 (CN) .......................... 202110461999.X

(51) Int. Cl.
*H05K 5/02* (2006.01)
*G06F 1/18* (2006.01)

(52) U.S. Cl.
CPC ............. *H05K 5/023* (2013.01); *G06F 1/181* (2013.01)

(58) Field of Classification Search
CPC .................................................... H05K 5/023
See application file for complete search history.

(56) References Cited

U.S. PATENT DOCUMENTS

| | | | | |
|---|---|---|---|---|
| 5,845,978 A * | 12/1998 | Jung | ....................... | H05K 5/023 220/759 |
| 5,931,550 A * | 8/1999 | Chen | ....................... | G06F 1/181 312/265.5 |
| 6,449,171 B1 * | 9/2002 | Karnes | ................. | H05K 9/0016 361/728 |
| 7,804,690 B2 * | 9/2010 | Huang | ............... | H05K 7/20736 361/679.48 |
| 8,453,837 B1 * | 6/2013 | Liu | ......................... | H05K 5/023 220/759 |
| 8,590,108 B2 * | 11/2013 | Baik | ........................ | G06F 1/181 16/419 |
| 8,944,529 B2 * | 2/2015 | Chen | ........................ | G06F 1/181 16/413 |
| 2008/0112129 A1 * | 5/2008 | Kuo | ........................... | G06F 1/20 361/692 |
| 2015/0315811 A1 * | 11/2015 | Mao | ......................... | E05B 5/003 292/336.3 |
| 2021/0204420 A1 * | 7/2021 | Chen | ..................... | H05K 7/1487 |

FOREIGN PATENT DOCUMENTS

TW  201328495 A  7/2013
TW  M579476 U  6/2019

* cited by examiner

*Primary Examiner* — Sherman Ng
(74) *Attorney, Agent, or Firm* — ScienBiziP, P.C.

(57) ABSTRACT

A chassis with built-in handles which do not add to dimensional clearance required for the chassis to be placed in a cavity includes a side plate, a mounting unit, and a handle. A mounting groove is defined on the side plate. The mounting unit is coupled to the side plate. The handle is partially clamped by the side plate and the mounting unit, and rotatably coupled with the side plate. By rotating the handle, the handle can be stored at least flush in the mounting groove.

12 Claims, 4 Drawing Sheets

CHASSIS WITH SUNKEN HANDLES FOR HANDLING CHASSIS AND COMPUTER

FIELD

The subject matter herein generally relates to chassis and computers.

BACKGROUND

A computer chassis is usually installed in a narrow cavity, so it is difficult to exert force on the chassis for moving. Such a configuration is very inconvenient for disassembly and maintenance.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
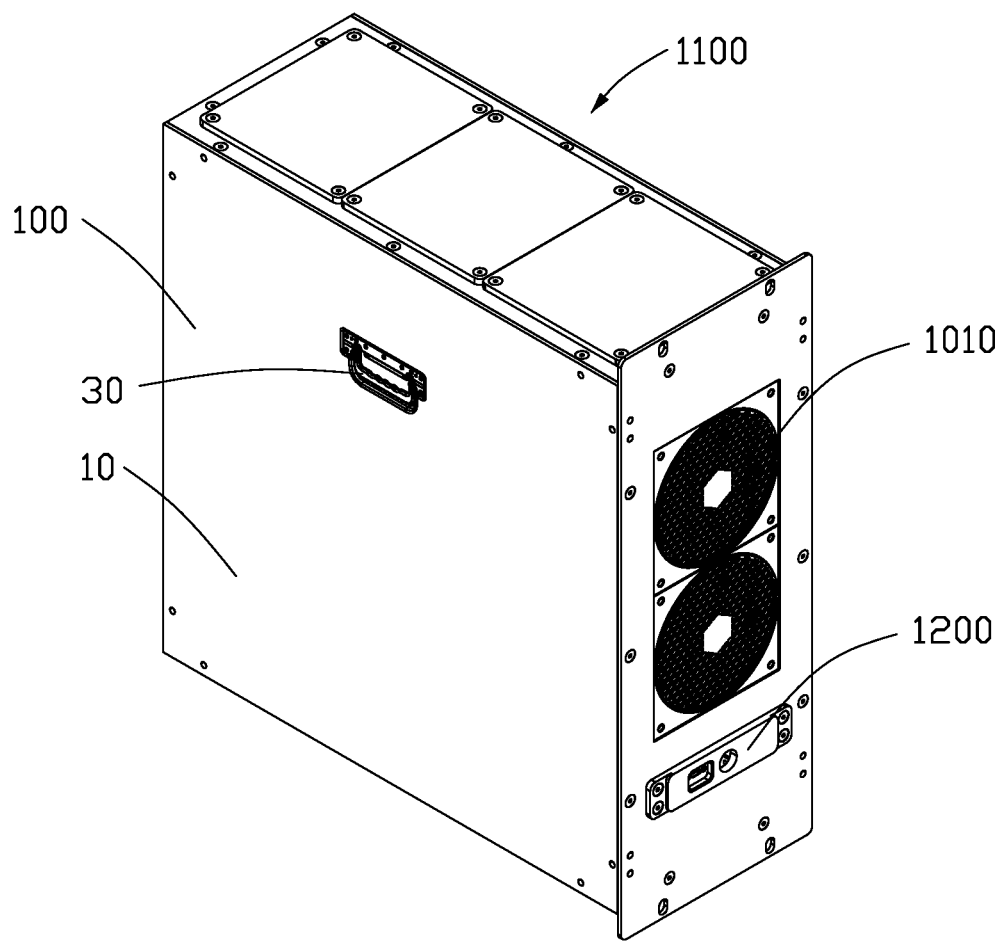
FIG. 1 is an isometric, assembled view of a computer according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a computer 1000 of an embodiment includes a mainboard 1200 and a chassis 1100. A mounting cavity 1010 is defined in the chassis 1100. The mainboard 1200 is coupled to the chassis 1100 and secured in the mounting cavity 1010. Part of the mainboard 1200 extends out of the mounting cavity 1010 and emerges from a surface of the chassis 1100. The chassis 1100 includes a side structure 100. The side structure 100 includes a side plate 10 and a handle 34. The handle 34 is rotatably connected with the side plate 10. A mounting groove 101 is defined in the side plate 10 for storing the handle 34. In an embodiment, the shape of the chassis 1100 may be a cuboid.

Figure 2:
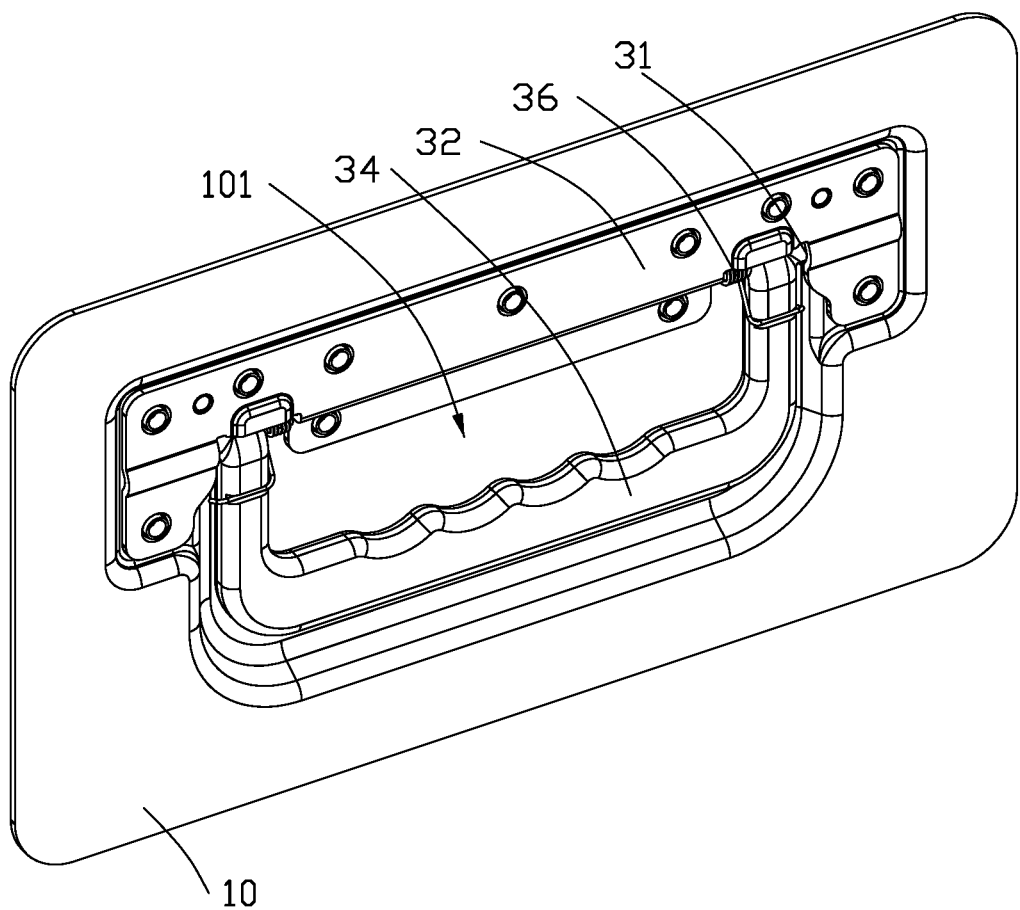
FIG. 2 is an isometric view of an assembled side structure according to an embodiment of the present disclosure.

As shown in FIG. 2, the handle 34 includes a second part 341 and two first parts 343. The second part 341 is between and coupled to the two first parts 343. A first surface 107 is defined by the bottom of the mounting groove 101. A second surface 105 is defined by the side plate 10 away from the first surface 107. When the second part 341 is in contact with the first surface 107, the handle 34 is arranged between the first surface 107 and the second surface 105.

A gripping surface is defined on the second part 341. Four human fingers can fit on the gripping surface when gripping the second part 341.

Figure 3:
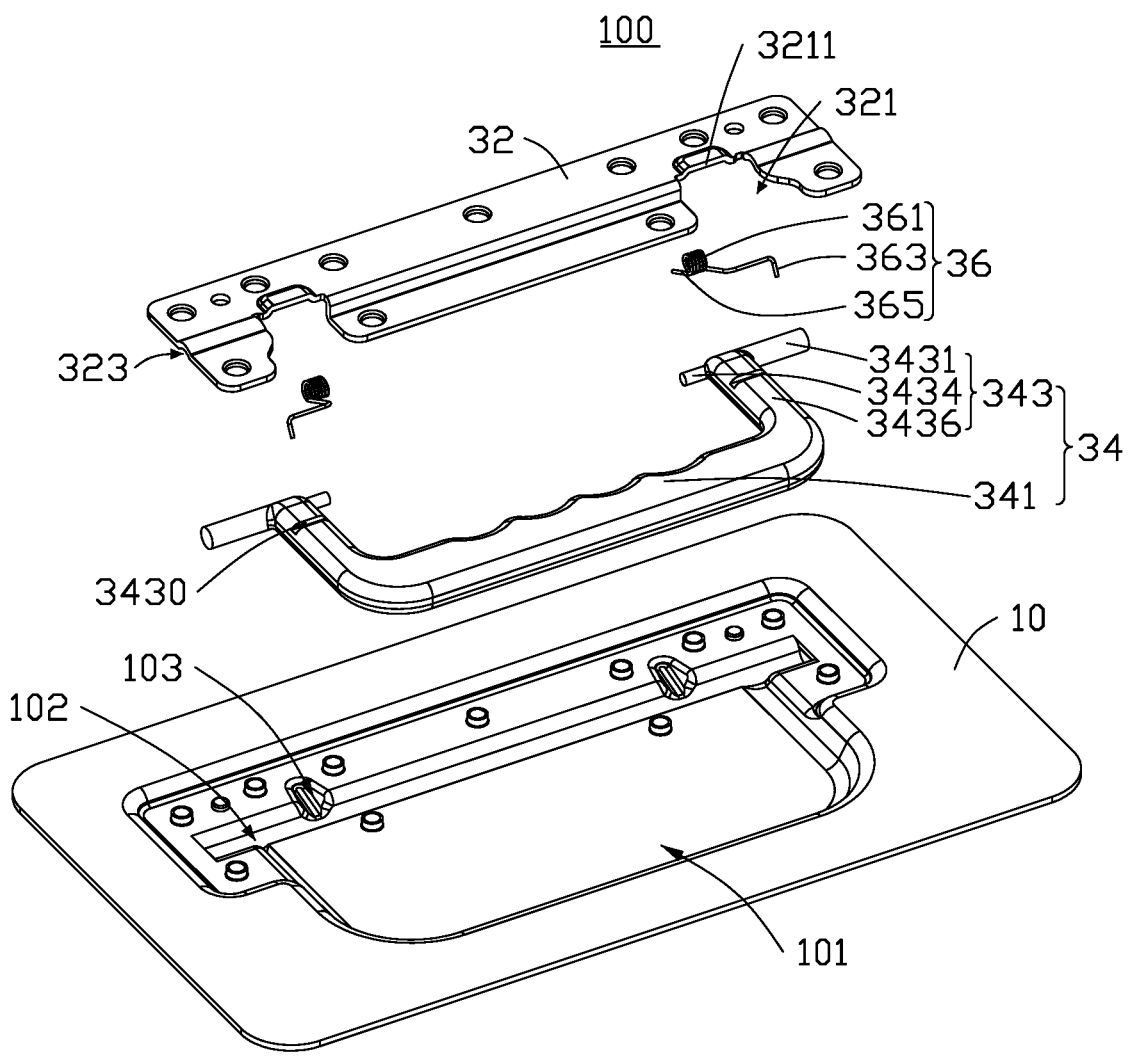
FIG. 3 is an exploded view of the side structure of FIG. 2.
Figure 4:
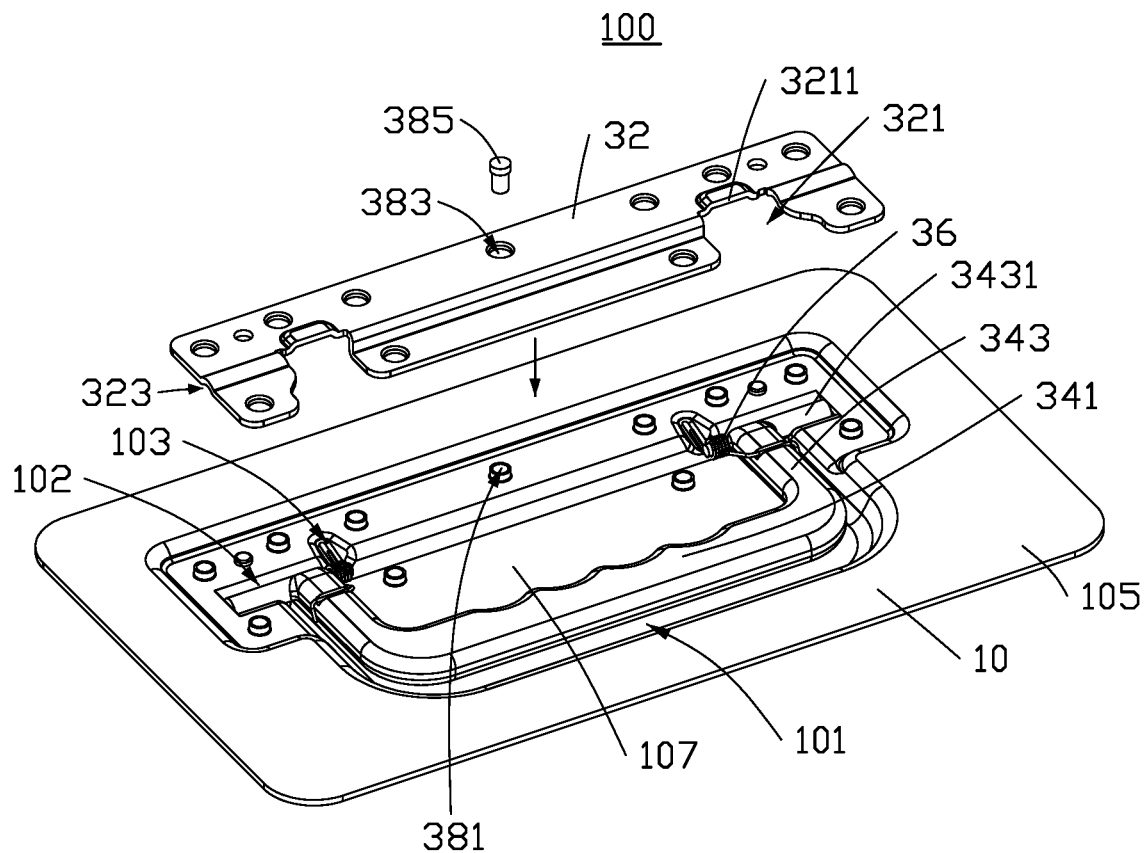
FIG. 4 is similar to FIG. 3, but showing an elastic member and a handle arranged on a side plate.

As shown in FIG. 3 and FIG. 4, the side structure 100 further includes a mounting unit 32. The mounting unit 32 is detachably connected to the side plate 10. The first part 343 includes a main body 3436 and a pivot part 3431. The main body 3436 is connected to the second part 341. The pivot part 3431 is connected to the main body 3436 away from the second part 341. The pivot part 3431 extends in a first direction. Two first grooves 102 are defined on the side plate 10. The first groove 102 is in the mounting groove 101. The pivot part 3431 is partially arranged in the first groove 102. When the mounting unit 32 is connected to the side plate 10, the pivot part 3431 is clamped by the mounting unit 32 and the side plate 10. The pivot part 3431 can be rotated around an axis parallel to the first direction, and the handle 34 can be rotated around the axis. Two second grooves 323 are defined on the mounting unit 32 for fitting the pivot part 3431. In an embodiment, the shape of the pivot part 3431 is cylindrical. When the mounting unit 32 is connected to the side plate 10, the first groove 102 and the second groove 323 combine to form a slot 31. The pivot part 3431 is arranged in the slot 31, and the surface of the pivot part 3431 is in contact with the inner face of the slot 31. In an embodiment, the slot 1100 may be substantially cylindrical.

When the computer 1000 is placed on a level surface and the second part 341 is in contact with the bottom of the mounting groove 101, the pivot part 3431 is above the second part 341. By gravity, the second part 341 maintains contact with the bottom of the mounting groove 101. Since the side plate 10 of the computer 1000 is blocked by environmental components, ingress of dust into the mounting groove 101 is insignificant, so that free rotation of the pivot part 3431 is not prevented by accumulated dust.

Two notches 321 are defined in the mounting unit 32. When the handle 34 is rotated around the pivot part 3431, the notch 321 can provide a space for the main body 3436 to prevent the main body 3436 from squeezing the mounting unit 32. A resisting surface 3211 is formed by an inner surface of each of the two notches 321. When the computer 1000 is placed on the level surface, the resisting surface 3211 is facing the level surface. When the handle 34 is rotated around the pivot part 3431 until the first part 343 contacts the resisting surface 3211, the resisting surface 3211 can stop the handle 34, so that, when an external force is applied to the handle 34, the external force can be transmitted to the side plate 10 through the mounting unit 32.

The side structure 100 further includes two elastic members 36. The elastic member 36 is in contact with the side plate 10 and the handle 34 for driving the handle 34 into the mounting groove 101. The first part 343 further includes a bulge 3434. The bulge 3434 is connected to the main body 3436 away from the second part 341. The main body 3436 is between the bulge 3434 and the pivot part 3431. The elastic member 36 is a torsion spring. The elastic member 36 includes a deformation part 361, a first arm 363, and a second arm 365. The deformation part 361 is between and coupled to the first arm 363 and the second arm 365. The deformation part 361 is sleeved on the bulge 3434, the first arm 363 presses on the main body 3436, and the second arm 365 presses on the side plate 10. The deformation part 361 stores elastic potential energy when the handle 34 is forced around the pivot part 3431 so that the second part 341 is away from the first surface 107. The torsion spring will rotate the handle 34 around the pivot part 3431 to attach the first surface 107 when releasing the force on the handle 34. The bulge 3434 is coaxial with the pivot part 3431. When the torsion spring releases the elastic potential energy, the torsion spring can apply a uniform force to the handle 34 for rotating the handle 34 around the pivot part 3431.

A depth of the mounting groove 101 is defined as the distance from the first surface 107 to the second surface 105 along a second direction. The second direction is perpendicular to the first direction. Both the first surface 107 and the second surface 105 are perpendicular to the second direction. A thickness of the handle 34 is defined along the second direction. The depth of the mounting groove 101 is greater than the thickness of the handle 34.

In another embodiment, the elastic member 36 can be a tension spring. One end of the tension spring is connected to the handle 34, and the other end of the tension spring is connected to the side plate 10.

In another embodiment, there is no elastic member 36. If not held or rotated by a user, gravity will rotate the handle 34 around the pivot part 3431.

A first cavity 3430 is defined in the main body 3436. The first arm 363 extends into the first cavity 3430, and contacts an inner face of the first cavity 3430. A second cavity 103 is defined on the side plate 10. The second arm 365 extends into the second cavity 103, and contacts an inner face of the second cavity 103.

A plurality of the threaded holes 381 is defined on the side plate 10. A plurality of through holes 383 is defined in the mounting unit 32. The side structure 100 includes a plurality of screws 385. The screws 385 are connected with the threaded hole 381 through the through hole 383, so that the side plate 10 is detachably connected to the mounting unit 32.

Before lifting the side structure 100, the second part 341 is driven away from the first surface 107 by the handle 34. A user holds the handle 34 and lifts the chassis 1100. When the handle 34 is released, the elastic member 36 will rotate the handle 34 for driving the second part 341 close to the first surface 107. When the second part 341 contacts the first surface 107, the handle 34 is arranged between the first surface 107 and the second surface 105. Even if the computer 1000 is placed in a tight-fitting cavity, the second surface 105 may contact an inner face of the tight-fitting cavity but not the handle 34. So, the handle 34 in the mounting groove 101 will not affect the placement of the computer 1000.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims.

What is claimed is:

1. A chassis comprising: a side plate defining a mounting groove; a mounting unit coupled to the side plate; and a handle partially clamped by the side plate and the mounting unit, the handle being rotatably coupled with the side plate, wherein the mounting groove is configured for storing the handle; an elastic member, wherein the elastic member is coupled to the side plate and the handle, and the handle is rotatable by the elastic member into the mounting groove, wherein the handle comprising: two first parts; and a second part between and coupled to the two first parts; each of the two first parts is rotatably coupled with the side plate; when the two first parts are rotated relatively to the side plate, the second part is brought out of the mounting groove; wherein a first groove is defined in the side plate; each of the two first parts comprising: a main body coupled to the second part; a pivot part coupled to the main body away from the second part, and partially arranged in the first groove; and wherein a second groove is defined in the mounting unit; a slot is shaped by a combination of the first groove and the second groove; the pivot part is in the slot, and a surface of the pivot part is in contact with an inner surface of the slot.

2. The chassis of claim 1, wherein: a gripping surface is defined in the second part, the gripping surface is configured for gripping.

3. The chassis of claim 1, wherein: a notch is defined in the mounting unit, the notch defines a space configured for the main body when the handle is rotated relative to the side plate.

4. The chassis of claim 1, wherein: each of the two first parts further comprises a bulge; the elastic member is sleeved on the bulge.

5. The chassis of claim 4, wherein: the elastic member comprises: a deformation part sleeved on the bulge; a first arm coupled to the deformation part, and pressed on the handle; and a second arm coupled to the deformation part, and pressed on the side plate.

6. The chassis of claim 5, wherein: a first cavity is defined on the handle, and the first arm is configured to extend into the first cavity; a second cavity is defined in the side plate, and the second arm is configured to extend into the second cavity.

7. A chassis comprising: a side plate defining a mounting groove; a mounting unit coupled to the side plate; and a handle partially clamped by the side plate and the mounting unit, the handle being rotatably coupled with the side plate, wherein a first surface is defined by bottom of the mounting groove, a second surface is defined by the side plate away from the first surface; a depth is defined as the distance from the first surface to the second surface; a thickness is defined by the handle; the depth is greater than the thickness of the handle; an elastic member, wherein the elastic member is coupled to the side plate and the handle, and the handle is rotatable by the elastic member into the mounting groove, wherein the handle comprising: two first parts; and a second part between and coupled to the two first parts; each of the two first parts is rotatably coupled with the side plate; when the two first parts are rotated relatively to the side plate, the second part is brought out of the mounting groove; wherein a first groove is defined in the side plate; each of the two first parts comprising: a main body coupled to the second part; a pivot part coupled to the main body away from the second part, and partially arranged in the first groove; and wherein a second groove is defined in the mounting unit; a slot is shaped by a combination of the first groove and the second groove; the pivot part is in the slot, and a surface of the pivot part is in contact with an inner surface of the slot.

8. The chassis of claim 7, wherein: a gripping surface is defined on the second part, the gripping surface is configured for gripping.

9. The chassis of claim 7, wherein: a notch is defined on the mounting unit, the notch defines a space configured for the main body when the handle is rotated relative to the side plate.

10. The chassis of claim 7, wherein: each of the two first parts further comprising a bulge; the elastic member is sleeved on the bulge.

11. The chassis of claim 10, wherein: the elastic member comprises: a deformation part sleeved on the bulge; a first arm coupled to the deformation part, and pressed on the handle; a second arm coupled to the deformation part, and pressed on the side plate.

12. A computer comprising: a chassis, a mounting cavity is defined in the chassis; a mainboard secured in the mounting cavity; the chassis comprises: a side plate defining a mounting groove; a mounting unit coupled to the side plate; and a handle partially clamped by the side plate and the mounting unit, the handle being rotatably coupled with the side plate, wherein the mounting groove is configured for storing the handle; an elastic member, wherein the elastic member is coupled to the side plate and the handle, and the handle is rotatable by the elastic member into the mounting groove, wherein the handle comprising: two first parts; and a second part between and coupled to the two first parts; each of the two first parts is rotatably coupled with the side plate; when the two first parts are rotated relatively to the side plate, the second part is brought out of the mounting groove; wherein a first groove is defined in the side plate; each of the two first parts comprising: a main body coupled to the second part; a pivot part coupled to the main body away from the second part, and partially arranged in the first groove; and wherein a second groove is defined in the mounting unit; a slot is shaped by a combination of the first groove and the second groove; the pivot part is in the slot, and a surface of the pivot part is in contact with an inner surface of the slot.

* * * * *